(12) United States Patent
Imai

(10) Patent No.: US 6,913,867 B2
(45) Date of Patent: Jul. 5, 2005

(54) NEGATIVE PHOTOSENSITIVE RESIN COMPOSITION, NEGATIVE PHOTOSENSITIVE DRY FILM AND METHOD OF FORMING PATTERN

(75) Inventor: Genji Imai, Hiratsuka (JP)

(73) Assignee: Kansai Paint Co., Ltd., Amagasaki (JP)

( * ) Notice: Subject to any disclaimer, the term of this patent is extended or adjusted under 35 U.S.C. 154(b) by 113 days.

(21) Appl. No.: 09/976,279

(22) Filed: Oct. 15, 2001

(65) Prior Publication Data

US 2002/0068237 A1 Jun. 6, 2002

(30) Foreign Application Priority Data

Oct. 16, 2000 (JP) ........................... 2000-315647

(51) Int. Cl.[7] ............... G03F 7/038; G03F 7/42; G03F 7/38
(52) U.S. Cl. .................. 430/258; 430/259; 430/270.1; 430/325
(58) Field of Search ............... 430/258, 259, 430/270.1, 325

(56) References Cited

U.S. PATENT DOCUMENTS

| | | | |
|---|---|---|---|
| 5,098,806 A | | 3/1992 | Robillard ..................... 430/10 |
| 5,801,212 A | * | 9/1998 | Okamoto et al. ............ 522/16 |
| 6,033,826 A | * | 3/2000 | Urano et al. ............ 430/270.1 |
| 6,106,999 A | * | 8/2000 | Ogiso et al. ............. 430/281.1 |
| 6,140,025 A | * | 10/2000 | Imai et al. ................. 430/325 |
| 6,277,541 B1 | * | 8/2001 | Uno et al. ................ 430/278.1 |

FOREIGN PATENT DOCUMENTS

| | | |
|---|---|---|
| JP | 09-138502 | 5/1997 |
| JP | 11-212252 | 8/1999 |
| JP | 2000-035665 | 2/2000 |
| JP | 2000-056450 | 2/2000 |
| JP | 2000-275823 | 10/2000 |

OTHER PUBLICATIONS

Aldrich Handbook of Fine Chemicals adn Laboratory Equipmen 2000–2001, p. 453.*
JPO machine translation of JP 09–138502.*
Taiwanese Office Action dated Feb. 25, 2003.
International Search Report dated Dec. 25, 2001.

* cited by examiner

Primary Examiner—Yvette C. Thornton
(74) Attorney, Agent, or Firm—Armstrong, Kratz, Quintos, Hanson & Brooks, LLP

(57) ABSTRACT

The present invention provides a negative photosensitive resin composition comprising (A) a photocurable resin having a photosensitive group or groups crosslinkable by light irradiation, (B) a photoacid generator and (C) a photosensitizer which is a benzopyran condensed ring compound capable of increasing photosensitivity to visible light with a wavelength of 480 nm or more, a negative photosensitive dry film prepared by applying the photosensitive resin composition to a surface of support film, followed by drying, to form a photosensitive resin layer, and a method of forming a pattern using the resin composition or the dry film.

9 Claims, No Drawings

NEGATIVE PHOTOSENSITIVE RESIN COMPOSITION, NEGATIVE PHOTOSENSITIVE DRY FILM AND METHOD OF FORMING PATTERN

TECHNICAL FIELD

The present invention relates to novel negative photosensitive resin compositions, negative photosensitive dry films and methods of forming patterns.

BACKGROUND ART

Negative photosensitive resin compositions have been widely used in paints, inks, adhesives, resist materials, printing plate materials, information recording materials, materials for producing relief images, etc., because of their excellent characteristics such as non-polluting properties, resource- and energy-saving properties, high production efficiency and the like.

Negative photosensitive resin compositions are used in various applications, by utilizing the solubility difference occurring between exposed and unexposed parts. Conventionally, exposure of these compositions is carried out using visible light with an emission spectrum wavelength of, for example, 488 nm or 532 nm. However, conventional negative photosensitive resin compositions are not sufficiently sensitive to visible light, especially to visible light with a wavelength of 480 nm or more. Thus, conventional negative photosensitive resin compositions are incapable of forming a sharp resist pattern coating.

DISCLOSURE OF THE INVENTION

An object of the present invention is to provide a novel negative photosensitive resin composition and negative photosensitive dry film, both having high sensitivity to visible light with a wavelength of 480 nm or more.

Another object of the present invention is to provide a method of forming a pattern using the resin composition or dry film.

Other objects and features of the present invention will become apparent from the following description.

The present invention provides the following negative photosensitive resin compositions, negative photosensitive dry films and methods of forming patterns.

1. A negative photosensitive resin composition comprising:
(A) a photocurable resin having a photosensitive group or groups crosslinkable by light irradiation,
(B) a photoacid generator, and
(C) a photosensitizer which is a benzopyran condensed ring compound capable of increasing photosensitivity to visible light with a wavelength of 480 nm or more.

2. A composition according to item 1, wherein the proportion of the photoacid generator (B) is about 0.01 to 10 parts by weight per 100 parts by weight of the resin (A).

3. A composition according to item 1, wherein the photosensitizer (C) is a benzopyran condensed ring compound represented by Formula (1)

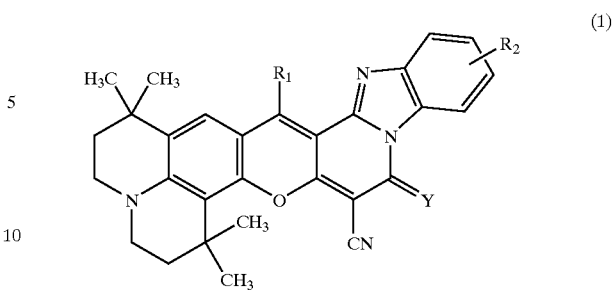

wherein $R_1$ is hydrogen, halogen, cyano, trifluoromethyl, carboxyl or carboxylic acid ester, $R_2$ is hydrogen, alkyl, alkoxy, cyano, trifluoromethyl, sulfoxy or halogen, and Y is NH or O.

4. A composition according to item 1, wherein the proportion of the photosensitizer (C) is about 0.1 to 10 parts by weight per 100 parts by weight of the total amount of the resin (A) and photoacid generator (B).

5. A composition according to item 1 which further comprises, as an photoacid proliferating agent (D), an organic acid ester (a) and/or a crosslinked carbocyclic compound (b) containing a crosslinked carbocyclic skeleton which has a hydroxyl group or groups bonded to any of the crosslinked carbocyclic rings and, at a carbon atom or atoms adjacent to the hydroxyl-bearing carbon atom or atoms, a sulfonate group represented by Formula (2)

$$-OSO_2-R_5 \qquad (2)$$

wherein $R_5$ is acyl, aliphatic hydrocarbon, polycyclic aromatic hydrocarbon or a heterocyclic group.

6. A composition according to item 1 which is an organic solvent-based resin composition.

7. A composition according to item 1 which is an aqueous resin composition.

8. A negative photosensitive dry film prepared by applying a negative photosensitive resin composition according to item 1 to a surface of support film, followed by drying, to form a negative photosensitive resin layer.

9. A method of forming a pattern comprising the steps of:
(1) applying a negative photosensitive resin composition according to item 1 to a substrate, followed by drying, to form a negative photosensitive resin coating,
(2) irradiating the resin coating with visible light directly or through a mask so as to obtain a desired pattern, and
(3) removing the unirradiated part of the negative photosensitive resin coating by development to form a resist pattern coating.

10. A method of forming a pattern comprising the steps of:
(1') attaching a negative photosensitive dry film according to item 8 to a substrate so that the photosensitive resin layer of the dry film is in contact with the substrate to form a negative photosensitive resin coating, and optionally peeling off the support film of the dry film,
(2) irradiating the resin coating with visible light directly or through a mask so as to obtain a desired pattern, and
(3') peeling off the support film of the dry film when the support film has not been peeled off, and removing the unirradiated part of the negative photosensitive resin coating by development to form a resist pattern coating.

The present inventors carried out intensive research to overcome the drawbacks of the prior art, and found that the drawbacks can be overcome by using, as a photosensitizer, a benzopyran condensed ring compound capable of increasing photosensitivity to visible light with a wavelength of 480 nm or more. The present invention has been accomplished based on this finding.

Negative Photosensitive Resin Composition

The negative resin composition of the present invention comprises (A) a photocurable resin having a photosensitive group or groups crosslinkable by light irradiation, (B) a photoacid generator and (C) a photosensitizer which is a benzopyran condensed ring compound capable of increasing sensitivity to visible light with a wavelength of 480 nm or more.

The photocurable resin (A) having a photosensitive group or groups crosslinkable by light irradiation for use in the invention is a compound which is cured and rendered insoluble by polymerization, etherification reaction, pinacol rearrangement, silanol dehydration reaction, intramolecular dehydration condensation reaction, hydrolysis condensation reaction or like reaction using, as a catalyst, an acid generated from the acid generator (B) by light irradiation.

Any conventional photocurable resin can be used as the photocurable resin (A) without limitation.

Resins usable as the resin (A) include, for example, glycidyl ether epoxy compounds, alicyclic epoxy compounds, vinyl ether compounds, alkoxyallene compounds, oxetane compounds, ketene acetal compounds, bicyclo ortho ester compounds, lactone compounds, aromatic vinyl compounds, heterocyclic vinyl compounds, melamine compounds and other aromatic compounds. These compounds may be low-molecular-weight or high-molecular-weight ones as long as they are curable by an acid. These compounds have a photosensitive group or groups such as epoxy, vinyl ether, allene, oxetane, acetal, ortho ester, lactone ring, vinyl, triazine ring and the like.

Glycidyl ether epoxy compounds include, for example, bisphenol A diglycidyl ether, (poly)ethylene glycol diglycidyl ether and trimethylolpropane diglycidyl ether.

Alicyclic epoxy compounds include, for example, those disclosed in J. Polym. Sci.: Part A: Polym. Chem. 28, 479 (1990). Specific examples include 3,4-epoxycyclohexylmethyl-3,4-epoxycyclohexane carboxylate, dicyclopentadiene dioxide, epoxycyclohexene carboxylic acid ethylene glycol diester, and 1,3-bis[2-{3(7-oxabicyclo[4.1.0]heptyl)}ethyl]-tetramethyldisiloxane.

Vinyl ether compounds include, for example, those disclosed in J. Polym. Sci.: Part A: Polym. Chem. 34, 2051 (1996). Specific examples include butylene glycol divinyl ether, trimethylolpropane di(1-propenyl) methyl ether, trimethylolpropane di(1-propenyl) butyl ether, trimethylolpropane di(1-propenyl) octyl ether, tetrimethylolpropane di(1-propenyl) phenyl ether, trimethylolpropane di(1-propenyl) ether acetate, trimethylolpropane di(1-propenyl) ether acrylate and trimethylolpropane di(1-propenyl) N-butyl carbonate.

Alkoxy allene compounds include, for example, those disclosed in J. Polym. Sci.: Part A: Polym. Chem. 33, 2493 (1995). Specific example include dodecyl allene (DA), diethylene glycol diallene (DEGA), triethylene glycol diallene (TEGA), 1-tetrahydrofurfuryl allene ether (THFA), N-hexyloxy-1,2-propadiene (HA), 1,4-di-N-butoxy-1,2-butadiene (DBB), 1,4-diethoxy-1,2-butadiene, and N-hexylpropazyl ether (HPE).

Oxetane compounds include, for example, those disclosed in J. Polym. Sci.: Part A: Polym. Chem. 33, 1807 (1995). Specific examples include 3-ethyl-3-phenoxymethyl-oxetane, phenoxymethyloxetane, methoxymethyloxetane and 3-methyl-3-methoxymethyl-oxetane.

Ketene acetal compounds include, for example, those disclosed in J. Polym. Sci.: Part A: Polym. Chem. 34, 3091 (1996). Specific examples include 2-propylidene-4,5-dimethyl-1,3-dioxolane, 2-propylidene-4-methyl-1,3-dioxolane and 3,9-dimethylidene-2,4,8,10-tetraoxapiro[5.5] undecane.

Bicyclo ortho ester compounds include, for example, those disclosed in J. Polym. Sci.: Polym. Lett. Ed. 23, 359 (1985). Specific examples include 1-phenyl-4-ethyl-2,6,7-trioxabicyclo[2.2.2]octane.

Lactone compounds include, for example, propiolactone, butyrolactone, γ-valerolactone, γ-caprolactone, γ-caprylolactone, γ-laurylolactone and coumarin.

Aromatic vinyl compounds include methoxy-α-methylstyrene and the like.

Heterocyclic vinyl compounds include vinyl carbazole and the like.

Melamine compounds include, for example, hexamethylolmelamine and hexamethoxymelamine.

Other aromatic compounds include, for example, copolymers of p-vinylphenol and p-vinylbenzyl acetate, trimethylolbenzene and tri(acetoxycarbonylmethyl)benzene.

The photoacid generator (B) for use in the negative photosensitive resin composition of the invention is a compound capable of generating an acid when exposed. The generated acid acts as a catalyst to cure the photocurable resin (A). Known photoacid generators are usable, which include sulfonium salts, ammonium salts, phosphonium salts, iodonium salts, selenium salts and like onium salts; iron-allene complexes; silanol-metal chelate complexes; triazine compounds; diazide naphthoquinone compounds; sulfonic acid esters; sulfonic acid imide esters; and halogen compounds.

Among these compounds, preferred are onium salts, sulfonic acid imide esters and the like. Also usable are photoacid generators disclosed in Japanese Unexamined Patent Publication No. 1995-146552 and Japanese Patent Application No. 1997-289218.

Specific examples of iodonium salts include chlorides, bromides, borofluorides, hexafluorophosphate salts or hexafluoroarsenate salts of diphenyliodonium, ditolyliodonium, phenyl(p-anisyl)iodonium, bis(m-nitrophenyl)iodonium, bis(p-chlorophenyl)iodonium or like iodonium.

Specific examples of sulfonium salts include triarylsulfonium salts and dialkyl-4-hydroxysulfonium salts.

Specific examples of phosphonium salts include triarylphosphonium salts.

Specific examples of sulfonic acid esters include benzoin tosylate, pyrogallol trimesylate, o-nitrobenzyl tosylate, 2,5-dinitrobenzyl tosylate, N-tosyl phthalic acid imide, α-cyanobenzylidene tosyl amine and p-nitrobenzil-9,10-diethoxyanthracene-2-sulfonate.

Specific examples of sulfonic acid imide esters include imide sulfonate.

Specific examples of silanol-metal chelate complexes include silanol-aluminium complexes.

Commercial products of photoacid generators are, for example, Cyracure UVI-6970, Cyracure UVI-6974, Cyracure UVI-6990 and Cyracure UVI-6950 (tradenames of Union Carbide Corp. (U.S.)), Irgacure 261 (a tradename of Ciba Specialty Chemicals), SP-150 and SP-170 (tradenames of Asahi Denka Kogyo K.K.), CG-24-61 (a tradename of Ciba Specialty Chemicals), DAICAT-11 (a tradename of Daicel Chemical Industries, Ltd.), CI-2734, CI-2758 and CI-2855 (all tradenames of Nippon Soda Co., Ltd.), PI-2074 (a tradename of Rhone Poulenc SA, pentafluorophenylborate tolyl cumyl iodonium salt), FFC509 (a tradename of 3M), BBI102 and NAI-105 (tradenames of Midori Kagaku Co., Ltd.), etc.

The photoacid generator (B) can be used as mixed with the resin (A) or as bonded to the resin (A).

Resins containing the photoacid generator (B) incorporated into the skeleton of the resin (A) are, for example, resins which generate acid groups when exposed, to thereby enable alkali development. Examples of such resins include those in which a naphthoquinone diazide sulfonic acid is bonded to an acrylic resin or like resin containing ion-forming groups via a sulfonic acid ester linkage (see Japanese Unexamined Patent Publications No. 1986-206293 and No. 1995-133449). When these resins are irradiated with light, quinone diazide groups contained therein are photolyzed to form indenecarboxylic acid via ketene.

The proportion of the photoacid generator (B) is usually about 0.01 to 10 parts by weight, preferably about 0.1 to 5 parts by weight, per 100 parts by weight of the curable resin (A). The photoacid generator does not show its effect when used in a proportion less than 0.01 parts by weight. On the other hand, more than 10 parts by weight of the photoacid generator results in poor curability and high cost. Thus, proportions outside the specified range are undesirable.

The photosensitizer (C) for use in the composition of the invention is a benzopyran condensed ring compound capable of increasing photosensitivity to visible light with a wavelength of 480 nm or more. The benzopyran condensed ring compound is preferably one represented by Formula (1).

In Formula (1), the halogen atoms represented by $R_1$ and $R_2$ each may be, for example, fluorine or chlorine. Examples of the carboxylic acid ester group represented by $R_1$ include ethyl carboxyl, butyl carboxyl, octyl carboxyl, 4-butylphenyl carboxyl and 4-hexylcyclohexyl carboxyl. The alkyl group represented by $R_2$ include methyl, ethyl, butyl, octyl, dodecyl and octadecyl. Examples of the alkoxy group represented by $R_2$ include methoxy and ethoxy.

As specific examples of the benzopyran condensed ring compound of Formula (1), the following compounds can be mentioned.

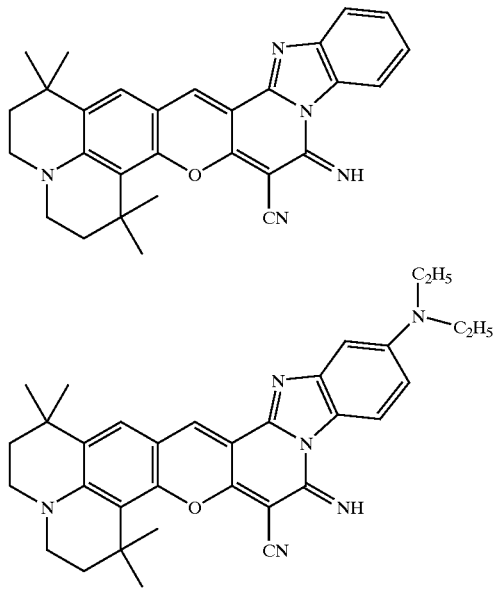

-continued

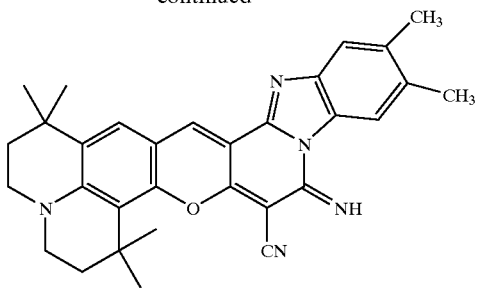

In the present invention, photosensitizing dyes can be used as required, in addition to the photosensitizer (C). Examples of photosensitizing dyes include thioxanthene dyes, xanthene dyes, ketone dyes, thiopyrylium salt dyes, base styryl dyes, merocyanine dyes, 3-substituted coumarin dyes, 3,4-substituted coumarin dyes, cyanine dyes, acridine dyes, thiazine dyes, phenothiazine dyes, anthracene dyes, coronene dyes, benzanthracene dye, perylene dyes, merocyanine dyes, ketocoumarin dyes, fumarine dyes, borate dyes and other photosensitizing dyes. Usable borate photosensitizing dyes include, for example, those shown in Japanese Unexamined Patent Publications No. 1993-241338, No. 1995-5685 and No. 1995-225474.

The proportion of the photosensitizer (C) for use in the composition of the invention is preferably about 0.1 to 10 parts by weight, especially about 0.3 to 5 parts by weight, per 100 parts by weight of the total amount of the resin (A) and photoacid generator (B).

The composition of the invention may further comprise a photoacid proliferating agent (D), if necessary.

Preferred as the photoacid proliferating agent (D) are an organic acid ester (a) and a crosslinked carbocyclic compound (d) containing a crosslinked carbocyclic skeleton which has a hydroxyl group or groups bonded to any of the crosslinked carbocyclic rings and, on a carbon atom or atoms adjacent to the hydroxyl-bearing carbon atom or atoms, a sulfonate group represented by Formula (2)

$$-OSO_2-R_5 \qquad (2)$$

wherein $R_5$ is acyl, aliphatic hydrocarbon, polycyclic aromatic hydrocarbon or a heterocyclic group. The aliphatic hydrocarbon group represented by $R_5$ in Formula (2) may be, for example, chain or cyclic (including crosslinked carbocyclic) alkyl or alkenyl. The aliphatic hydrocarbon group has usually 1 to 12, preferably 1 to 8, carbon atoms. The polycyclic aromatic hydrocarbon group may be, for example, naphthyl, biphenyl or naphthylmethyl. The heterocyclic group may have a monocyclic or polycyclic structure, and may be any hetetocyclic group derived from various known heterocyclic compounds. These aliphatic hydrocarbon group, polycyclic aromatic hydrocarbon group and heterocyclic group may be substituted by halogen, hydrocarbonoxy, amino, substituted amino or the like.

Examples of acyl groups include formyl, acetyl, benzoyl and cinnamoyl. Examples of aliphatic hydrocarbon groups and polycyclic aromatic hydrocarbon groups include methyl, ethyl, propyl, butyl, hexyl and like alkyl groups; vinyl, propenyl, allyl and like alkenyl groups; cyclohexyl, cyclooctyl, bicyclo hydrocarbon, tricyclo hydrocarbon and like cycloalkyl groups; naphthyl, naphthylmethyl, biphenyl and like aryl or arylalkyl groups; and these groups in a substituted form. Specific examples of heterocyclic groups include those derived from various heterocyclic compounds, such as furan, thiophene, pyrrole, benzofuran, thionaphthene, indole, carbazole and like five-membered ring compounds containing one hetero atom, and condensed ring compounds thereof; oxazole, thiazole, pyrazole and like five-membered compounds having two hetero atoms, and condensed ring compounds thereof; pyran, pyrone, coumarine, pyridine, quinoline, isoquinoline, acridine and like six-membered compound having one hetero atom, and condensed ring compounds thereof; and pyridazine, pyrimidine, pyrazine, phthalazine and like six-membered compounds containing two hetero atoms, and condensed ring compounds thereof.

The photoacid proliferating agent (D), when used in combination with the photoacid generator (C), is decomposed by an acid released from the photoacid generator (C) by light irradiation to thereby produce a free acid. The produced free acid further decomposes the photoacid proliferating agent so that a free acid is further produced. Thus, the photoacid proliferating agent is decomposed in a chain-like manner by light irradiation, thereby forming numerous free acid molecules.

The organic acid ester (a) is a compound substituted by a residue of a relatively strong acid and capable of readily producing an acid by elimination in the presence of a photoacid generator. Specifically stated, the ester (a) is decomposed by an acid generated from a photoacid generator and produces an acid (hereinafter referred to as "ZOH"). Since at least one acid molecule is produced by one reaction, the acid concentration is acceleratedly increased as the reactions proceed, and thus the composition is remarkably improved in photosensitivity. Preferred acid strength of the generated acid (ZOH) is an acid dissociation constant (pKa) not greater than 3, especially not greater than 2. A weaker acid is incapable of causing elimination reaction by an acid catalyst. As examples of the acid (ZOH), there can be mentioned dichloroacetic acid, trichloroacetic acid, methanesulfonic acid, ethanesulfonic acid, benzenesulfonic acid, p-toluenesulfonic acid, naphthalenesulfonic acid, phenylphosphonic acid and the like.

The first example of the photoacid proliferating agent (D) is an organic acid ester compound represented by Formula (4):

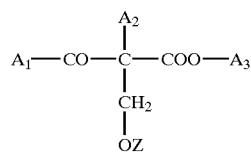

(4)

wherein $A_1$ is $C_1$ to $C_6$ alkyl or aryl, $A_2$ is $C_1$ to $C_6$ alkyl, $A_3$ is bis(p-alkoxyphenyl)methyl, 2-alkyl-2-propyl, 2-aryl-2-propyl, cyclohexyl or tetrahydropyranyl, Z is a residue of an acid represented by the formula ZOH and having a pKa not greater than 3.

In Formula (4), the $C_1$ to $C_6$ alkyl groups represented by $A_1$ and $A_2$ each may be, for example, methyl, ethyl, propyl or the like. The aryl group represented by $A_1$ may be, for example, phenyl or the like.

When an acid acts on the compound of Formula (4), the ester group decomposes into carboxylic acid. Further, decarboxylation is caused to eliminate the acid (ZOH). Specific examples of the compound of Formula (4) are as follows.

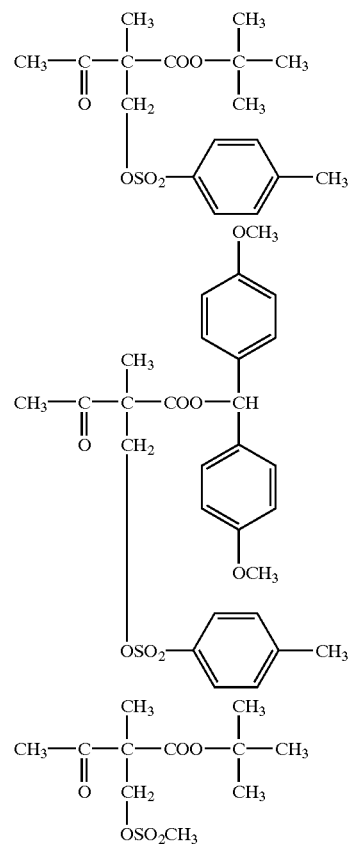

The second example of the photoacid proliferating agent (D) is an acetal- or ketal-containing organic acid ester represented by Formula (5):

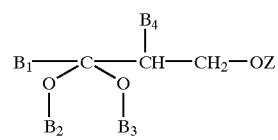

(5)

wherein Z is a residue of an acid represented by ZOH and having a pKa not greater than 3, $B_1$ is hydrogen, alkyl or aryl, $B_2$ and $B_3$ are each methyl or ethyl, or $B_2$ and $B_3$ are bonded together to form ethylene or propylene, and $B_4$ is hydrogen or methyl.

The alkyl group represented by $B_1$ in Formula (5) may be, for example, methyl, ethyl, propyl or the like. The aryl group represented by $B_1$ may be, for example, phenyl or the like.

In the compound of Formula (5), acetal or ketal is decomposed by an acid into β-aldehyde or ketone, from which ZOH is easily eliminated. Specific examples of the compound of Formula (5) are as follows:

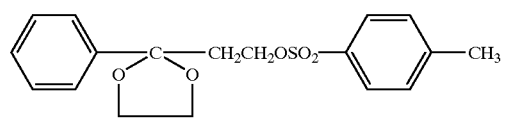

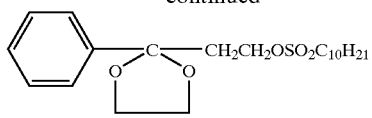

The third example of the photoacid proliferating agent (D) is an organic acid ester represented by Formula (6):

(6)
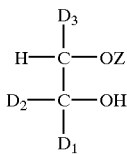

wherein Z is a residue of an acid represented by ZOH and having a pKa not greater than 3, $D_1$ and $D_3$ are each $C_1$ to $C_6$ alkyl, or $D_1$ and $D_3$ are bonded together to form alkylene or substituted alkylene constituting an alicyclic structure, and D2 is hydrogen, $C_1$ to $C_6$ alkyl or aryl.

In Formula (6), the $C_1$ to $C_6$ alkyl groups represented by $D_1$, $D_2$ and $D_3$ each may be methyl, ethyl, propyl or the like. The alkylene or substituted alkylene group formed by $D_1$ and $D_3$ to constitute an alicyclic structure may be, for example, heptylene or the like. An example of the aryl group represented by $D_2$ is phenyl or the like.

It is presumed that, in the compound of Formula (6), the hydroxyl group is eliminated by an acid catalyst to form a carbocation, undergoes hydrogen transfer and then generates ZOH. Specific examples of the compound of Formula (6) are as follows.

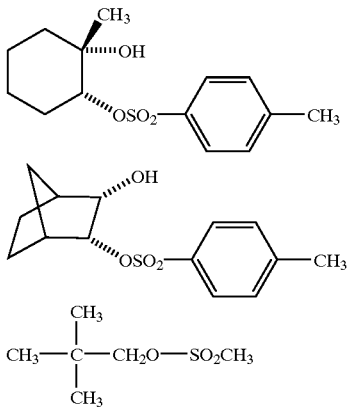

The fourth example of the photoacid proliferating agent (D) is an epoxy ring-containing organic acid ester represented by Formula (7).

(7)
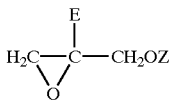

wherein Z is a residue of an acid represented by ZOH and having a pKa not greater than 3, and E is $C_1$ to $C_6$ alkyl or phenyl.

Examples of the $C_1$ to $C_6$ alkyl group represented by E in Formula (7) include methyl, ethyl and propyl.

It is presumed that, when an acid acts on the compound of Formula (7), the epoxy ring opens to form a cation at the β-carbon and an organic acid is generated as a result of hydrogen transfer. Specific examples of the compound of Formula (7) include the following:

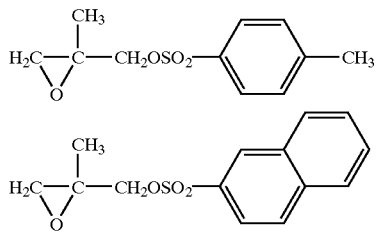

Also usable as the organic acid ester are, for example, cis-3-(p-toluenesulfonyloxy)-2-pinanol as a monofunctional compound, and the following compounds as multifunctional compounds.

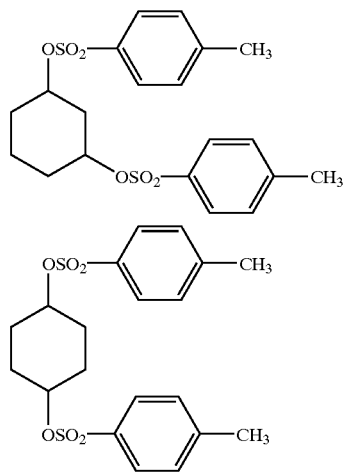

The organic acid ester is stable at room temperature as long as no acid acts thereon. A specific acid strength is required for decomposition of the compound in the presence of an acid catalyst. A preferred acid strength is a pKa not greater than 3, especially not greater than 2. A weak acid having a pKa over 3 is incapable of causing reaction of the photoacid proliferating agent.

The crosslinked carbocyclic compound (b) for use as the photoacid proliferating agent (D) contains a crosslinked carbocyclic skeleton which has a hydroxyl group or groups bonded to any of the crosslinked carbon rings and, on a carbon atom or atoms adjacent to the hydroxyl-bearing carbon atom or atoms, a sulfonate group represented by Formula (2).

The compound (b) is decomposed by acid catalytic reaction and generates an acid ($R_5SO_3H$). One acid molecule is generated by one reaction, so that acid molecules are increased acceleratedly as the reactions proceed. For inducing self-decomposition of the generated acid, the acid strength of the generated acid is an acid dissociation constant (pKa) not greater than 3, especially not greater than 2. A weaker acid is not incapable of inducing self-decomposition. Examples of acids ($R_5SO_3H$) released by such reactions include methanesulfonic acid, ethanesulfonic acid, propanesulfonic acid, butanesulfonic acid, pentanesulfonic acid, hexanesulfonic acid, heptanesulfonic acid, octanesulfonic acid, cyclohexanesulfonic acid, camphorsulfonic acid, trifluoromethanesulfonic acid, 2,2,2-trifluoroethanesulfonic acid, benzenesulfonic acid, p-toluenesulfonic acid, p-bromobenzenesulfonic acid, p-nitrobenzenesulfonic acid, 2-thiophenesulfonic acid, 1-naphthalenesulfonic acid and 2-naphthalenesulfonic acid.

The compound (b) to be used as a photoacid proliferating agent can be decomposed in a chain-like manner by heating in the presence of an acid generated from a photoacid generator.

The compound (b) is characterized by having a crosslinked carbocyclic skeleton structure, such as a crosslinked structure comprising more than one, usually 2 to 6, preferably 2 to 3, carbocyclic rings. The crosslinked carbocyclic rings may have substituent(s) such as methyl, ethyl, propyl or like $C_1$ to $C_6$, preferably $C_1$ to $C_3$ lower alkyl, or unsaturated bond(s) such as double bond. The crosslinked carbocyclic rings have, within the molecule, crosslink(s) which rigidify the molecule, thus giving a photoacid proliferating agent with improved thermal stability.

As preferred examples of the compound (b), compounds represented by the following Formulas (8) to (11) can be mentioned.

(8)

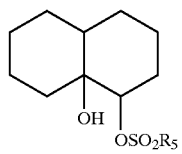

(9)

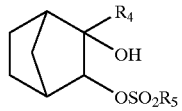

(10)

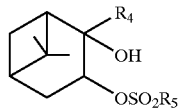

(11)

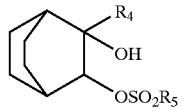

In the above Formulas, $R_5$ is as defined above, and $R_4$ is hydrogen, aliphatic hydrocarbon or aromatic hydrocarbon. Aliphatic hydrocarbon groups include chain or cyclic (including crosslinked cyclic) alkyl or alkenyl. Aromatic hydrocarbon groups include aryl, arylalkyl or the like. The aliphatic hydrocarbon and aromatic hydrocarbon groups may be substituted by halogen, alkoxy, amino, substituted amino or the like.

The aliphatic hydrocarbon group has 1 to 12, preferably 1 to 8, carbon atoms. The aromatic hydrocarbon group may have a monocyclic or polycyclic structure. $R_4$ is preferably aliphatic hydrocarbon or aromatic hydrocarbon.

Examples of alkyl groups include methyl, ethyl and propyl. Examples of alkenyl groups include propenyl. Examples of aryl groups include phenyl. The halogen atom may be, for example, fluorine or chlorine.

The bicyclo compound of Formula (8) (a decalin derivative) has crosslinks at the 1- and 6-positions. The bicyclo compounds of Formulas (9) and (11) have crosslinks at the 1- and 4-positions. The bicyclo compound of Formula (10) has crosslinks at the 1- and 3-positions. Therefore, in these bicyclo compounds, conformational change of the cyclohexane ring is highly suppressed and thus the ring structure shows rigidity.

Specific examples of the compound of Formula (10) are as follows.

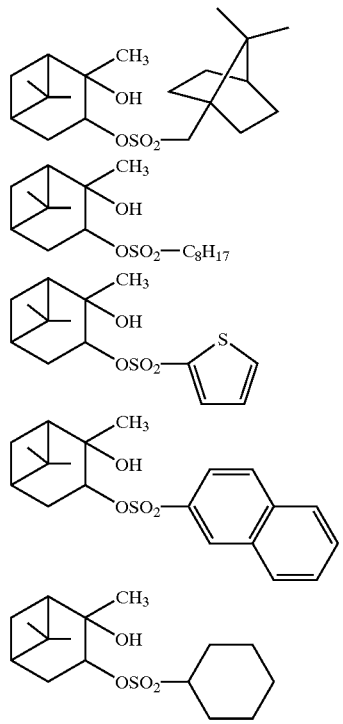

The composition of the invention may contain, as required, other known resin(s). Examples of other resins include phenol resins, polyester resins, acrylic resins, vinyl resins, rubber resins and urethane resins.

Further, the composition of the invention may optionally contain an adhesion promoter; hydroquinone, 2,6-di-t-butyl-p-cresol, N,N-diphenyl-p-phenylenediamine or like polymerization inhibitor; a rubber, a vinyl polymer, an unsaturated group-containing vinyl polymer or like particulate organic resin; a coloring pigment, an extender pigment and like pigment; a dye; cobalt oxide or like metal oxide; dibutyl phthalate, dioctyl phthalate, tricresyl phosphate, polyethylene glycol, polypropylene glycol or like plasticizer; an anti-cissing agent; a fluidity modifier; or the like.

The adhesion promoter is used to improve adhesion of a coating to a substrate. Specific examples of adhesion promoters include tetrazole, 1-phenyltetrazole, 5-aminotetrazole, 5-amino-1-methyltetrazole, 5-amino-2-phenyltetrazole, 5-mercapto-1-phenyltetrazole, 5-mercapto-1-methyltetrazole, 5-methylthiotetrazole, 5-chloro-1-phenyl-1H-tetrazole and like tetrazoles.

The negative photosensitive resin composition of the invention can be prepared by mixing the ingredients in a routine manner. Use of a solvent is optional in the preparation of the composition.

The organic solvent-based negative photosensitive resin composition of the invention can be prepared by dissolving or dispersing the ingredients in an organic solvent such as a ketone, an ester, an ether, a cellosolve, an aromatic hydrocarbon, an alcohol or a halogenated hydrocarbon, in a routine manner. The organic solvent-based composition has a solid concentration of preferably about 1 to 50 wt. %.

The aqueous negative photosensitive resin composition of the invention can be prepared by dissolving or dispersing the ingredients in water in a routine manner. An aqueous organic solvent may be used in combination with water. The resin composition is rendered water-soluble or water-dispersible by neutralizing carboxyl groups or amino groups in the resin contained in the composition, with an alkali or an acid. The aqueous composition has a solid concentration of usually about 1 to 50 wt. %.

Negative Photosensitive Dry Film

The negative photosensitive resin composition of the invention is usable as a negative photosensitive dry film.

The negative photosensitive dry film of the invention is prepared by applying a negative photosensitive resin composition to a surface of support film, followed by drying, to form a negative photosensitive resin layer.

Usable as the support film are, for example, a film made of polyethylene terephthalate, low-density polyethylene or like material. These films are preferably transparent so that irradiation can be performed through the films.

The negative photosensitive resin layer is formed on a surface of the support film usually by applying a negative photosensitive resin composition to the support film by roller coating, roll coater coating, spray coating, gravure coating or like coating process, and then drying the applied composition to volatilize water and organic solvent. During drying, the applied composition may be heated, if necessary.

The support film is usually about 5 to 100 $\mu$m thick, and the negative photosensitive resin layer is usually about 1 to 100 $\mu$m thick.

Usually, the negative photosensitive dry film is attached to a surface of a substrate and irradiated with light before or after peeling off the support film.

Use of the Negative Photosensitive Resin Composition and Negative Photosensitive Dry Film The negative photosensitive resin composition and negative photosensitive dry film of the invention are excellent in sensitivity to visible light, storage stability and other properties. Thus, the composition and dry film are widely useful in conventional applications of photosensitive materials, such as paints, inks, adhesives, resist materials, printing plate materials, information recording materials, materials for producing relief images, etc.

Resist materials include, for example, photoresists, solder resists and plating resists. Printing plate materials include, for example, materials for flat plates, relief plates, and PS plates for offset printing.

Method of Forming a Pattern

The negative photosensitive resin composition and negative photosensitive dry film of the invention are suitably usable as negative photoresists for forming a pattern coating on a printed board or like substrate.

The pattern forming method of the invention which employs a negative photosensitive resin composition comprises the steps of:

(1) applying the negative photosensitive resin composition of the invention to a substrate, followed by drying, to form a negative photosensitive resin coating,
(2) irradiating the resin coating with visible light directly or through a mask so as to obtain a desired pattern, and
(3) removing the unirradiated part of the negative photosensitive resin coating is removed by development to form a resist pattern coating.

In step (1), the negative photosensitive resin composition is applied to a substrate and dried to form a negative photosensitive coating.

Usable substrates include electrical insulation glass-epoxy plates, polyethylene terephthalate films, polyimide films and like plastic films and plastic plates; these plastic plates and plastic films having a conductive layer formed by attaching foil of copper, aluminium or like metal; substrates having a conductive layer formed by vacuum deposition, chemical vapor deposition, plating or like process using copper, nickel, silver or like metal or a compound of a conductive oxide (typically indium tin oxide (ITO)) or the like; plastic plates and plastic films provided with a through hole portion, whose surface and through hole portion are covered with a conductive layer; and metal plates such as copper plates.

The resin composition can be applied to a substrate by a process such as roller coating, roll coater coating, spin coater coating, curtain roll coater coating, spray coating, electrostatic coating, dip coating, silk printing or spin coating.

After applying the organic solvent-based or aqueous negative photosensitive resin composition to a substrate, the composition is optionally set and dried at about 50 to 130° C. to form a negative photosensitive resin coating.

The photosensitive resin coating thus formed preferably has a dry thickness of about 0.5 to 100 $\mu$m, especially about 1 to 50 $\mu$m.

The photosensitive resin coating may be provided with a cover coat before curing by visible light exposure. The cover coat layer blocks oxygen in air and protects radicals generated by exposure from being inactivated by oxygen, so that the photosensitive resin coating is cured smoothly when exposed.

The cover coat layer can be formed by, for example, covering the surface of the photosensitive resin coating with a resin film made of a polyester resin (e.g., polyethylene terephthalate), an acrylic resin, polyethylene, a polyvinyl chloride resin (film thickness: about 1 to 70 $\mu$m).

Alternatively, the cover coat layer can be formed by applying an aqueous coating liquid obtained by dissolving or dispersing, in water, polyvinyl alcohol; partially saponified polyvinyl acetate; a polyvinyl alcohol-vinyl acetate copolymer; a partially saponified polyvinyl acetate-vinyl acetate copolymer; polyvinylpyrrolidone; pullulan and like water-soluble polysaccharide polymer; or an acrylic resin, a polyester resin, a vinyl resin, an epoxy resin or like aqueous resin containing basic group(s), acid group(s) or base(s), to the surface of the photosensitive resin coating to a dry thickness of about 0.5 to 5 $\mu$m, followed by drying. The cover coat layer is preferably removed after exposure of the surface of the photosensitive resin coating and before development of the coating. The cover coat can be removed using water, aqueous acid solution, aqueous basic solution or like aqueous solvent which dissolves or disperses the resin in the aqueous coating liquid.

In step (2), the resin coating formed in step (1) is irradiated with visible light either directly or through a mask to obtain a desired pattern. The irradiation cures the negative photosensitive resin coating so that a desired resist pattern coating can be formed in the subsequent step (3).

Examples of lights usable for exposure include those in the visible region obtained by cutting, with a UV cutoff filter, lights from conventional light sources, such as extra-high-pressure, high-pressure, medium-pressure or low-pressure mercury lamps, chemical lamps, carbon arc lamps, xenon lamps, metal halide lamps, fluorescent lights, tungsten lamps and sunlight. Also usable are-various lasers that produce an oscillating beam in the visible region. As laser sources, an argon laser (oscillating beam at 488 nm) or SHG-YAG laser (532 nm) are preferable since they have a stable high output.

In step (3), the part of the negative photosensitive resin coating not irradiated in step (2) is removed by development to form a resist pattern coating.

The development can be preferably carried out by a liquid development process. In the liquid development process, the resin coating is, for example, sprayed with or dipped in a developer at about 10 to 80° C., preferably at about 15 to 50° C., for about 1 to 60 minutes, preferably about 2 to 30 minutes, so as to form a pattern from the resin coating.

The liquid development process can be carried out, for example, using an alkaline developer when the coating-forming resin contains acid group(s); or using an acid developer when the resin contains basic group(s); or using a water developer when the resin contains hydrophilic group(s); or using an organic solvent developer when the resin is soluble or dispersible in organic solvents.

Alkaline developers include, for example, aqueous solutions of monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide and the like.

Acid developers include, for example, aqueous solutions of formic acid, crotonic acid, acetic acid, propionic acid, lactic acid, hydrochloric acid, sulfuric acid, nitric acid, phosphoric acid and the like.

It is usually preferable that these developers have an acid or alkali concentration of about 0.05 to 10 wt. %.

Examples of organic solvents include hexane, heptane, octane, toluene, xylene, dichloromethane, chloroform, carbon tetrachloride, trichloroethylene and like hydrocarbon solvents; methanol, ethanol, propanol, butanol and like alcohol solvents; diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether and like ether solvents; acetone, methyl ethyl ketone, methyl isobutyl ketone, isophorone, cyclohexanone and like ketone solvents; methyl acetate, ethyl acetate, propyl acetate, butyl acetate and like ester solvents; pyridine, formamide, N,N-dimethyl formamide and like other solvents.

Thus, steps (1), (2) and (3) produce a desired resist pattern coating.

The pattern forming method of the invention which employs a negative photosensitive dry film comprises the steps of:

(1') attaching a negative photosensitive dry film of the invention to a substrate in such a manner that the photosensitive resin layer of the dry film is in contact with the substrate, to form a negative photosensitive resin coating, and optionally peeling off the support film of the dry film, (2) irradiating the resin coating with visible light directly or through a mask so as to obtain a desired pattern, and (3') peeling off the support film of the dry film when the support film has not been peeled off, and removing the unirradiated part of the negative photosensitive resin coating by development to form a resist pattern coating.

In step (1'), a negative photosensitive dry film is attached to a substrate so that the photosensitive resin layer on the support film is in contact with the substrate, to form a negative photosensitive resin coating.

Useful substrates are as mentioned above. The support film may, but need not, be peeled off in this step. Drying is not necessary because a dry film is utilized.

Step (2) is as described above.

Step (3') is the same as step (3) except that the support film of the dry film is peeled off when the support film has not been peeled off in step (1').

Thus, steps (1'), (2) and (3') produce a desired resist pattern coating.

The method of the invention is capable of forming an extremely fine pattern with excellent contrast.

The method of the invention may be modified to be adapted to various applications, as long as it comprises the above steps.

The method finds applications in various industries including: electrical industries such as electrical components, lighting, electronic devices, semiconductors, printed circuits, electronic communication and electric power; physical industries such as measurement, optics, display, sound, control, automatic selling, signals and information recording; chemical, metallurgical and fiber industries such as inorganic chemistry, organic chemistry, macromolecular chemistry, metallurgy and fibers; processing and transportation industries such as separation and mixing, metal working, plastic working, printing, containers and packaging; daily necessities industries such as agricultural and marine products, foods, fermentation, household goods, health and recreation; and mechanical engineering industries.

Specific examples of applications in electrical industries include formation of black matrix insulating coatings, formation of insulating coatings by build-up process, formation of solder resist insulating coatings, formation of walls for display panels, formation of black belts for display panels, formation of colored insulating coatings for color filters, fluorescent materials for display panels, hologram patterns, CD mastering, coils, etc. Specific examples of applications in physical industries include optical fiber processing, floppy disks, magnetic tapes, magnetic cards, optical components, wave absorbers, etc. Specific examples of applications in chemical, metallurgical and fiber industries include glass, cement, ceramics and like inorganic insulating materials. Specific examples of applications in processing and transportation industries include printed matters, original printing plates, diffraction grating, marking, barcodes, masks, filters, etching, defrosters, cement processing, stone processing, fiber processing, plastic processing, labels, etc. Specific examples of applications in daily necessities industries include carriers, cosmetic products, fermentation industries, etc. Specific examples of applications in mechanical engineering industries include micromachine components, etc.

BEST MODE FOR CARRYING OUT THE INVENTION

The following Examples are provided to illustrate the present invention in further detail. In these examples, parts and percentages are all by weight.

EXAMPLE 1

An organic solvent-based negative photosensitive resin composition (I) was prepared by mixing 167 parts of a butylated melamine resin having a molecular weight of about 8,000 (a 60% solution of xylol/butanol (weight ratio: 50/50)), 1 part of Cyracure UVI-6990 (a tradename of Union Carbide Corporation (U.S.), a photoacid generator), 1 part of cis-3-(p-toluenesulfonyloxy)-2-pinanol and 1 part of the following benzopyran condensed ring compound.

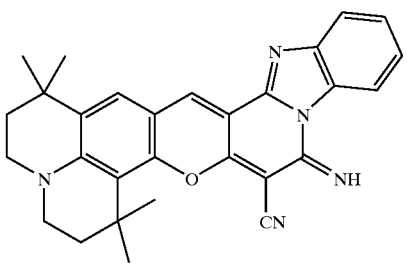

The composition (I) was applied to an aluminum plate coated with an epoxy primer, using a roll coater to a dry thickness of 20 μm and dried to form a negative photosensitive resin coating. The resin coating was irradiated with 300 mJ/cm² of visible light with a wavelength of 480 nm or more emitted from a metal halide lamp covered with a filter, and heated at 110° C. for 15 minutes for curing. The cured coating had a pencil hardness of H and high solvent resistance.

Separately, a negative photosensitive resin coating obtained in the same manner as above is irradiated with the same amount of the same visible light as above through a pattern mask, and heated at 110° C. for 15 minutes for curing the irradiated part of the coating. Subsequently, the unirradiated part of the coating was removed by development with methanol, thereby giving an excellent pattern coating.

EXAMPLE 2

An organic solvent-based negative photosensitive resin composition (II) was prepared by mixing 100 parts of Nikalac MS-25 (a tradename of Sanwa Chemical Co., Ltd., a melamine resin having a nonvolatile content of 70%), 2 parts of CI-2855 (a tradename of Nippon Soda Co., Ltd., a photoacid generator), 1 part of cis-1-phenyl-2-p-toluenesulfonyloxy-1-cyclohexanol, 1 part of the following benzopyran condensed ring compound and 20 parts of titanium dioxide.

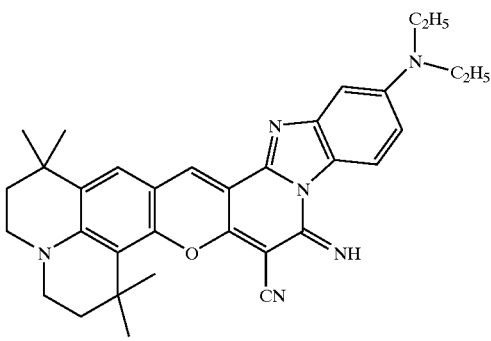

The composition (II) was applied to a surface-treated steel plate using a roll coater to a dry thickness of 10 μm and dried to form a negative photosensitive resin coating. The resin coating was irradiated with 400 mJ/cm² of visible light with a wavelength of 480 nm or more emitted from a metal halide lamp covered with a filter, and heated at 120° C. for 10 minutes for curing. The cured coating had a pencil hardness of F.

Separately, a negative photosensitive resin coating obtained in the same manner as above was irradiated with the same amount of the same visible light as above through a pattern mask, and heated at 120° C. for 10 minutes for curing the irradiated part of the coating. Subsequently, the unirradiated part of the coating was removed by development with methanol, giving an excellent pattern coating.

EXAMPLE 3

An organic solvent-based negative photosensitive resin composition (III) was prepared by mixing 140 parts of Phthalkyd 235-50 (a tradename of Hitachi Chemical Co., Ltd., an alkyd resin having a nonvolatile content of 50% and an oil length of 35), 55 parts of a butylated melamine resin having a molecular weight of about 5,000, 1 part of DAICAT-11 (a tradename of Daicel Chemical Industries, Ltd., a photoacid generator), 1 part of 1,4-di-p-toluenesulfonyloxy cyclohexane, 1 part of the following benzopyran condensed ring compound and 10 parts of calcium carbonate.

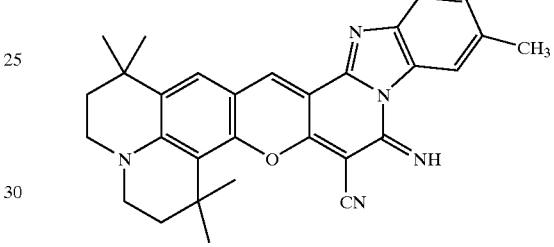

The composition (III) was applied to a primer-treated aluminium plate to a dry thickness of 30 μm by spray coating and dried to form a negative photosensitive resin coating. The resin coating was irradiated with 600 mJ/cm² of visible light with a wavelength of 480 nm or more emitted from a metal halide lamp covered with a filter, and heated at 110° C. for 20 minutes for curing. The cured coating had a pencil strength of H.

Separately, a negative photosensitive resin coating prepared in the same manner as above was irradiated with the same amount of the same visible light through a pattern mask, and heated at 110° C. for 20 minutes for curing the irradiated part of the coating. Subsequently, the unirradiated part of the coating was removed by development with methanol, giving an excellent pattern coating.

EXAMPLE 4

An organic solvent-based negative photosensitive resin composition (IV) was prepared by mixing 117 parts of an acrylic resin vanish (nonvolatile content: 60%, a styrene/n-butyl methacrylate/n-butyl acrylate/hydroxybutyl acrylate copolymer having a hydroxyl value of 100 mg KOH/g and a molecular weight of 8,000), 55 parts of a melamine resin vanish (nonvolatile content: 55%, molecular weight: 8,000), 1.5 parts of DAICAT-11 (a tradename of Daicel Chemical Industries, Ltd., a photoacid generator), 1.5 part of 1,3-di-p-toluenesulfonyloxy cyclohexane and 1 part of the following condensed benzopyran compound.

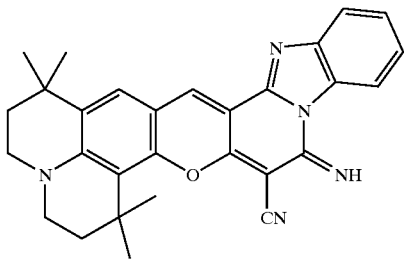

The composition (IV) was applied to a glass plate using a roll coater to a dry thickness of 5 μm and dried to form a negative photosensitive resin coating. The resin coating was irradiated with 200 mJ/cm$^2$ of visible light with a wavelength of 480 nm or more emitted from a metal halide lamp covered with a filter, and heated at 100° C. for 15 minutes for curing. The cured coating had a pencil strength of H.

Separately, a negative photosensitive resin coating obtained in the same manner as above was irradiated with the same amount of the same visible light as above, and heated at 100° C. for 15 minutes for curing the irradiated part of the coating. Subsequently, the unirradiated part of the coating was removed by development with methanol, giving an excellent pattern coating.

EXAMPLE 5

An organic solvent-based negative photosensitive resin composition (V) was prepared by mixing 127 parts of an acrylic resin vanish (nonvolatile content: 55%, a styrene/methyl methacrylate/n-butyl acrylate/hydroxyethyl acrylate/acrylic acid copolymer having a hydroxyl value of 85 mgKOH/g, an acid value of 40 mg KOH/g and a molecular weight of 10,000), 86 parts of Nikalac MS-35 (a tradename of Sanwa Chemical Co., Ltd., a melamine resin having a nonvolatile content of 35%), 0.5 part of CI-2855 (a tradename of Nippon Soda Co., Ltd., a photoacid generator), 1 part of 1,4-di-p-toluenesulfonyloxy cyclohexane and 1 part of the following benzopyran condensed ring compound.

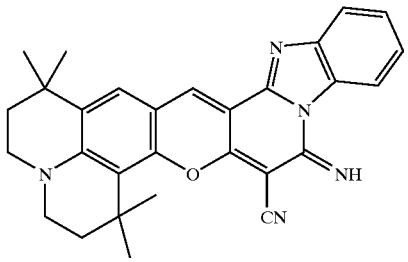

The composition (V) is applied to a polycarbonate plate by spray coating to a dry thickness of 20 μm and dried, giving a negative photosensitive resin coating. The resin coating was irradiated with 400 mJ/cm$^2$ of visible light with a wavelength of 480 nm or more emitted from a metal halide lamp covered with a filter, and heated at 100° C. for 15 minutes for curing. The cured coating had a pencil hardness of H.

Separately, a negative photosensitive resin coating prepared in the same manner as above was irradiated with the same amount of the same visible light as above through a pattern mask, and heated at 100° C. for 15 minutes for curing the irradiated part of the coating. Subsequently, the unirradiated part of the coating was removed by development with a 1.5% aqueous sodium carbonate solution, giving an excellent pattern coating.

EXAMPLE 6

An organic solvent-based negative photosensitive resin composition (VI) was prepared by mixing 150 parts of a water-soluble acrylic resin (emulsion type, nonvolatile content: 50%, hydroxyl value: 60 mg KOH/g, acid value: 45 mg KOH/g, molecular weight: 20,000), 25 parts of Cymel 303 (a tradename of Mitsui Cytec, Ltd., a water-soluble melamine resin), 1 part of CI-2758 (a tradename, Nippon Soda Co., Ltd., a photoacid generator), 0.5 part of 1,4-di-p-toluenesulfonyloxy cyclohexane and 1 part of the following benzopyran condensed ring compound.

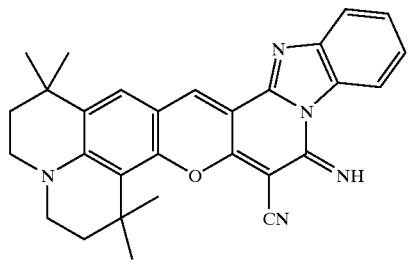

The composition (VI) was applied to a surface-treated steel plate using a roll coater to a dry thickness of 20 μm and dried, giving a negative photosensitive resin coating. The resin coating was irradiated with 600 mJ/cm$^2$ of visible light with a wavelength of 480 nm or more emitted from a metal halide lamp covered with a filter, and heated at 120° C. for 15 minutes for curing. The cured coating had a pencil hardness of 2H and high chemical resistance.

Separately, a negative photosensitive resin coating prepared in the same manner as above was irradiated with the same amount of the same visible light as above through a pattern mask, and heated at 120° C. for 15 minutes for curing the irradiated part of the coating. Subsequently, the unirradiated part of the coating was removed by development with a 1.5% aqueous sodium carbonate solution, giving an excellent pattern coating.

What is claimed is:

1. A negative photosensitive resin composition comprising:

(A) a photocurable resin having a photosensitive group or groups crosslinkable by light irradiation, (B) a photoacid generator, (C) a photosensitizer which is a benzopyran condensed ring compound capable of increasing photosensitivity to visible light with a wavelength of 480 nm or more, and (D) a photoacid proliferating agent which is an organic acid ester.

2. A composition according to claim 1, wherein the proportion of the photoacid generator (B) is about 0.01 to 10 parts by weight per 100 parts by weight of the resin (A).

3. A composition according to claim 1, wherein the photosensitizer (C) is a benzopyran condensed ring compound represented by Formula (1)

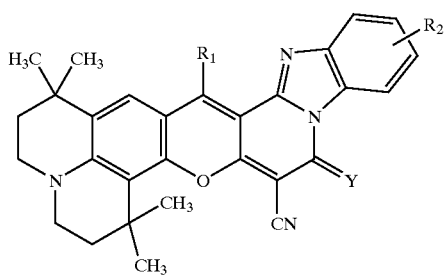

(1)

wherein $R_1$ is hydrogen, halogen, cyano, trifluoromethyl, carboxyl or carboxylic acid ester, $R_2$ is hydrogen, alkyl, alkoxy, cyano, trifluoromethyl, sulfoxy or halogen, and Y is NH or O.

4. A composition according to claim 1, wherein the proportion of the photosensitizer (C) is about 0.1 to 10 parts by weight per 100 parts by weight of the total amount of the resin (A) and photoacid generator (B).

5. A composition according to claim 1 which is an organic solvent-based resin composition.

6. A composition according to claim 1 which is an aqueous resin composition.

7. A negative photosensitive dry film prepared by applying a negative photosensitive resin composition according to claim 1 to a surface of support film, followed by drying, to form a negative photosensitive resin layer.

8. A method of forming a pattern comprising the steps of:
(1) applying a negative photosensitive resin composition according to claim 1 to a substrate, followed by drying, to form a negative photosensitive resin coating,
(2) irradiating the resin coating with visible light directly or through a mask so as to obtain a desired pattern, and
(3) removing the unirradiated part of the negative photosensitive resin coating by development to form a resist pattern coating.

9. A method of forming a pattern comprising the steps of:
(1') attaching a negative photosensitive dry film according to claim 7 to a substrate so that the photosensitive resin layer of the dry film is in contact with the substrate to form a negative photosensitive resin coating, and optionally peeling off the support film of the dry film,
(2) irradiating the resin coating with visible light directly or through a mask so as to obtain a desired pattern, and
(3') peeling off the support film of the dry film when the support film has not been peeled off, and removing the irradiated part of the negative photosensitive resin coating by development to form a resist pattern coating.

* * * * *